US008030926B2

(12) United States Patent
Avdievich et al.

(10) Patent No.: US 8,030,926 B2
(45) Date of Patent: Oct. 4, 2011

(54) SURFACE COIL ARRAYS FOR SIMULTANEOUS RECEPTION AND TRANSMISSION WITH A VOLUME COIL AND USES THEREOF

(75) Inventors: Nikolai I. Avdievich, Bronx, NY (US); Hoby P. Hetherington, Woodbridge, CT (US)

(73) Assignee: Albert Einstein College of Medicine of Yeshiva University, Bronx, NY (US)

( * ) Notice: Subject to any disclaimer, the term of this patent is extended or adjusted under 35 U.S.C. 154(b) by 330 days.

(21) Appl. No.: 12/224,478

(22) PCT Filed: Mar. 1, 2007

(86) PCT No.: PCT/US2007/005453
§ 371 (c)(1),
(2), (4) Date: Jan. 23, 2009

(87) PCT Pub. No.: WO2007/108914
PCT Pub. Date: Sep. 27, 2007

(65) Prior Publication Data
US 2009/0302841 A1     Dec. 10, 2009

Related U.S. Application Data

(60) Provisional application No. 60/783,125, filed on Mar. 15, 2006.

(51) Int. Cl.
*G01V 3/00* (2006.01)
(52) U.S. Cl. .................................................. 324/318
(58) Field of Classification Search .......... 324/300–322; 600/410–435; 333/219–235
See application file for complete search history.

(56) References Cited

U.S. PATENT DOCUMENTS

| | | | |
|---|---|---|---|
| 4,721,913 A | 1/1988 | Hyde et al. | |
| 4,724,389 A | 2/1988 | Hyde et al. | |
| 4,725,779 A | 2/1988 | Hyde et al. | |
| 4,812,761 A * | 3/1989 | Vaughan, Jr. | 324/307 |
| 4,866,387 A | 9/1989 | Hyde et al. | |
| 5,186,181 A * | 2/1993 | Franconi et al. | 607/156 |
| 5,805,114 A * | 9/1998 | Podger | 343/742 |
| 5,995,060 A * | 11/1999 | Podger | 343/807 |
| 6,169,401 B1 * | 1/2001 | Fujita et al. | 324/318 |
| 6,469,674 B1 * | 10/2002 | Podger | 343/742 |
| 6,853,342 B2 * | 2/2005 | Podger | 343/742 |
| 6,980,003 B2 | 12/2005 | Avdievich et al. | |
| 7,432,874 B2 * | 10/2008 | Meissner | 343/867 |
| 7,800,368 B2 * | 9/2010 | Vaughan et al. | 324/318 |
| 2003/0071622 A1 | 4/2003 | Reisker et al. | |
| 2005/0253581 A1 | 11/2005 | Avdievich et al. | |

OTHER PUBLICATIONS

Notification Concerning Transmittal of International Preliminary Report on Patentability, issued from the International Bureau of WIPO on Sep. 25, 2008 in connection with PCT International Patent Application No. PCT/US2007/005453.

(Continued)

*Primary Examiner* — Dixomara Vargas
(74) *Attorney, Agent, or Firm* — Amster Rothstein & Ebenstein LLP

(57) ABSTRACT

This invention provides arrays of counter rotating current surface coils for simultaneous reception and transmission with a volume coil for improved signal-to-noise ratio and radio frequency field homogeneity for in particular high-field (4-8 T) imaging of deep body regions, such as central brain structures.

17 Claims, 16 Drawing Sheets

OTHER PUBLICATIONS

Froncisz W et al., entitled "Counter Rotating Current Local Coils for High-Resolution Magnetic Resonance Imaging," Magnetic Resonance in Medicine, 3, 590-603, 1986.

Hyde J S et al., entitled "Simultaneous Image Acquisition from the Head (or Body) Coil and a Surface Coil," Magnetic Resonance in Medicine, 6, 235-239, 1988.

Avdievich N I et al., entitled "Simultaneous Reception from the Head Volume Coil and the Array of Counter Rotating Surface Coils (CRC) at 4T—an Alternative to Using Actively Detuned Transmit Volume Coils," Proc. Intl. Soc. Mag. Reson. Med. 13, p. 327 (2005).

Avdievich N I et al., entitled "Modified perturbation method for transverse electromagnetic (TEM) coil tuning and evaluation," Magn Reson Med, Jul. 2003;50(1):13-8, Abstract Only.

Avdievich N I at al., entitled "4 T actively detunable transmit/receive transverse electromagnetic coil and 4-channel receive-only phased array for (1)H human brain studies," Magn Reson Med, Dec. 2004;52(6):1459-64, Abstract Only.

Avdievich N I et al., entitled "Sense imaging with a quadrature half-volume tranverse electromagnetic (TEM) coil at 4T," J Magn Reson Imaging, Oct. 2006;24(4):934-8, Abstract Only.

Avdievich N I et al., entitled "Modified perturbation method for transverse electromagnetic (TEM) coil tuning and evaluation," Magn Reson Med, 2003, 50(1):13-8.

Avdievich N I et al., entitled "4 T actively detunable transmit/receive transverse electromagnetic coil and 4-channel receive-only phased array for (1)H human brain studies," Magn Reson Med, 2004, 52(6):1459-64.

Avdievich N I et al., entitled "SENSE imaging with a quadrature half-volume tranverse electromagnetic (TEM) coil at 4T," J Magn Reson Imaging, 2006, 24(4):934-8.

\* cited by examiner

A)

B)

A)

B)

A)

B)

A)

B)

C)

D)

A)

B)

C)

D)

E)

US 8,030,926 B2

SURFACE COIL ARRAYS FOR SIMULTANEOUS RECEPTION AND TRANSMISSION WITH A VOLUME COIL AND USES THEREOF

CROSS-REFERENCE TO RELATED APPLICATIONS

This application is a U.S. national stage entry under 35 U.S.C. §371 of PCT International Patent Application No. PCT/US2007/005453, filed Mar. 1, 2007, and claims priority to U.S. Provisional Patent Application No. 60/783,125, filed Mar. 15, 2006, the contents of which are incorporated herein by reference in their entirety.

STATEMENT OF GOVERNMENT SUPPORT

This invention was made with government support under grant numbers M01-RR12248 and R01-EB00473 awarded by the National Institutes of Health (NIH). The government has certain rights in the invention.

FIELD OF THE INVENTION

The present invention relates to arrays of counter rotating current (CRC) surface coils for simultaneous reception and transmission with a volume coil for improved signal-to-noise ratio (SNR) and radio frequency (RF) field homogeneity for imaging. The invention is especially useful for imaging deep body regions such as central brain structures at higher magnetic fields (>4 Tesla (T)).

BACKGROUND OF THE INVENTION

Throughout this application various publications are referred to in parenthesis. Full citations for these references may be found at the end of the specification immediately preceding the claims. The disclosures of these publications are hereby incorporated by reference in their entireties into the subject application to more fully describe the art to which the subject application pertains.

Magnetic resonance imaging (MRI) is widely used in clinical diagnosis. The SNR of a magnetic resonance image is dependent on a number of factors. A common way to improve SNR from restricted regions is by using a transmit-only volume coil with a receive-only surface coil phased array (1). Since their introduction by Roemer and colleagues (1), phased arrays have proven to be effective in extending the high sensitivity of a single surface coil to a much larger field-of-view (FOV). Due to strong coupling between surface coils in the phased array and the volume transmit coil, the volume coil is used as a "transmit-only" coil, typically being detuned during reception. Although phased arrays have superior SNR near the surface coils, it has not been possible to achieve substantial SNR increases in comparison to optimized head-size quadrature volume coils from central regions (7-8 cm depth) of the human head (2, 3). The region of increased SNR afforded by the arrays can be extended to include the center of the brain if the signals from an optimized volume coil can be combined with those from the array during simultaneous reception. However this combination can only yield significant improvements if 1) the interaction between the volume coil and the surface coil does not substantially degrade the performance of either coil and 2) if the noise acquired by each coil is uncorrelated.

Previously, Kocharian and colleagues employed simultaneous reception with conventional single-loop surface coils using a body coil (4) and a head volume coil (5). The authors did not evaluate quantitatively the change in the SNR due to simultaneous reception as compared with the surface coils alone. However, mutual inductive coupling between the volume coil and the single-loop surface coil altered the RF magnetic field $B_1$ profiles of both coils (5), which would have substantially decreased the overall array performance (6). Furthermore, as the size of the volume coil was reduced to be optimal for heads (5), the inductive coupling between the volume coil and the surface coils increased, thereby further reducing the SNR benefits of the array. Thus, in general single-turn surface coils when used in combination with volumes coils for simultaneous reception yield no or minimal increases in SNR.

To avoid interactions between the volume and the surface coils, Hyde and colleagues have reported a counter rotating current (CRC) surface coil consisting of two parallel rings carrying opposite currents (7). The opposing currents provide intrinsic isolation between the surface coil and the volume transmit coil, which enables simultaneous reception by both coils with improved SNR in areas where they have similar sensitivities. Although the CRC coil has much lower sensitivity than a single-turn coil of the same size when unloaded, when loaded such that sample losses dominate, the CRC's sensitivity becomes virtually indistinguishable from a single-turn surface coil at distances greater than approximately the distance between the two loops of the CRC coil (7). Simultaneous reception using a single CRC coil and a transmit volume coil has been demonstrated previously (8, 9); however, prior to the present invention, the configuration has not been extended to multiple CRC coils in phased arrays. Gradiometer coils, also consisting of two loops with opposite currents, have been described and used previously for nuclear quadrupole resonance (NQR) and low-field magnetic MRI applications (10, 11) to reduce the injected noise.

At higher fields (4 T and above), the sensitivity profile of a head-sized volume coil can be substantially altered due to RF field/tissue interaction (26-28). A very characteristic pattern with the RF magnetic field enhanced at the center of a human brain has been observed at 4 T (20, 26) and was even more pronounced at 7 T (26). SNR measured in the center of the central transaxial slice of the head was higher by 30% at 4 T (20, 26) and by 75% at 7 T (26) as compared to the peripheral SNR. Attempts to compensate the RF transmit field inhomogeneity both numerically (29, 30) and experimentally (31) have been made using multi-port excitation of a single volume coil (29) or of a tranceive phased array (30, 31). These methods improve field homogeneity due to combining a homogeneous mode with higher order modes produced by multi-mode volume coils or tranceive phased arrays, but result in substantial phase distortion. Thus, there remains a need for improved radio frequency (RF) field homogeneity and signal-to-noise ratio (SNR) enhancement for body imaging, especially for imaging deeper regions such as central brain structures.

SUMMARY OF THE INVENTION

The present invention provides surface coil arrays for simultaneous reception of a radio frequency magnetic field signal with a volume coil during imaging, where the array comprises a plurality of counter rotating current (CRC) coils arranged for positioning over the surface of a region to be imaged, wherein each CRC coil contains two loops where current flows in opposite direction in each loop, and wherein the CRC coil array provides simultaneous reception of the radio frequency magnetic field signal with the volume coil during imaging.

The invention also provides surface coil phased arrays for simultaneous transmission and reception of a radio frequency magnetic field signal with a quadrature volume coil during imaging, where the array comprises at least four counter rotating current (CRC) coils uniformly arranged for positioning around the surface of a region to be imaged, wherein each CRC coil contains two loops where current flows in opposite direction in each loop, wherein the radio frequency magnetic field transmitted by an individual coil is shifted out of phase with the radio frequency magnetic field transmitted by adjacent coils to produce a circularly polarized radio frequency magnetic field that is in phase with a circularly polarized radio frequency magnetic field generated by the quadrature volume coil, and wherein the CRC coil phased array provides simultaneous transmission and reception of the radio frequency magnetic field signal with the volume coil during imaging.

The invention further provides radio frequency systems for imaging where the systems comprise any of the surface coil arrays disclosed herein and a quadrature volume coil.

The present invention also provides methods of imaging a region of a subject, where the methods comprise simultaneously receiving, or simultaneously transmitting and receiving, a radio frequency magnetic field signal by a surface coil array and by a volume coil.

The apparatus and methods disclosed herein provide improved signal-to-noise ratio and improved radio frequency magnetic field homogeneity during imaging.

DETAILED DESCRIPTION OF THE INVENTION

Figure 1:
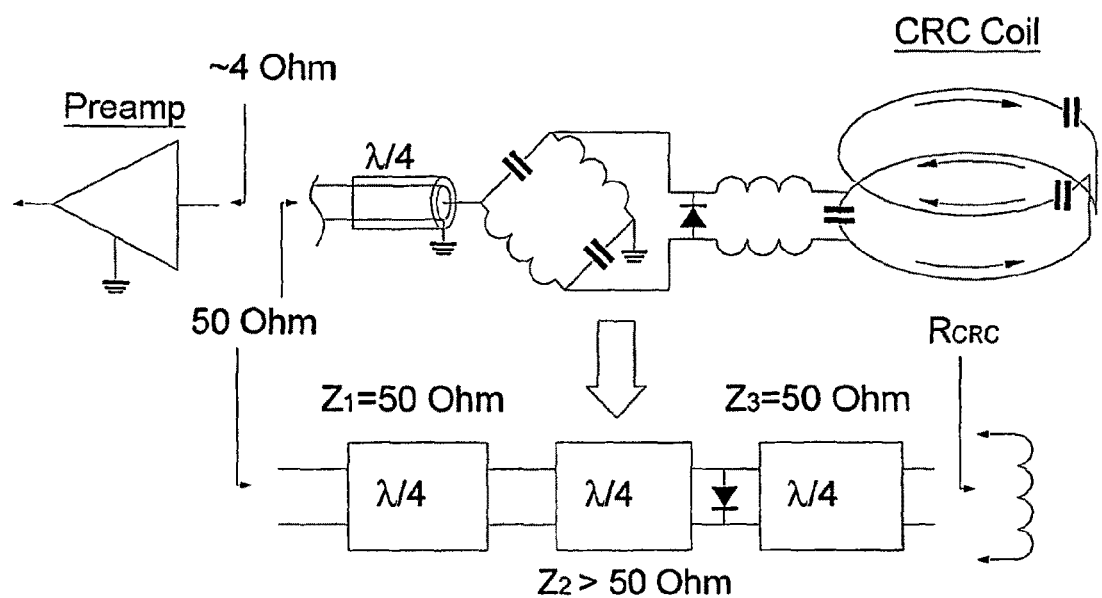
FIG. 1. Schematic of the CRC surface coil matching network including preamplifier decoupling.

The present invention provides surface coil arrays for simultaneous reception of a radio frequency (RF) magnetic field signal with a volume coil during imaging, where the array comprises a plurality of counter rotating current (CRC) coils arranged for positioning over the surface of a region to be imaged, wherein each CRC coil contains two parallel loops where current flows in opposite direction in each loop, and wherein the CRC coil array provides simultaneous reception of the radio frequency magnetic field signal with the volume coil during imaging.

The invention also provides surface coil phased arrays for simultaneous transmission and reception of a radio frequency (RF) magnetic field signal with a quadrature volume coil during imaging, where the array comprises at least four counter rotating current (CRC) coils uniformly arranged for positioning around the surface of a region to be imaged, wherein each CRC coil contains two parallel loops where current flows in opposite direction in each loop, wherein the radio frequency magnetic field transmitted by an individual coil is shifted out of phase with the radio frequency magnetic field transmitted by adjacent coils to produce a circularly polarized radio frequency magnetic field that is in phase with a circularly polarized radio frequency magnetic field generated by the quadrature volume coil, and wherein the CRC coil phased array provides simultaneous transmission and reception of the radio frequency magnetic field signal with the volume coil during imaging.

In different examples, the surface coil arrays comprise 3 to 64 CRC coils. In another example, the surface coil arrays comprise at least 8 CRC coils.

The surface coil array is intrinsically decoupled from the volume coil due to the presence of the two counter rotating loops in each coil.

Preferably, the distance between the loops of each CRC coil is adjusted to optimize i) decoupling between the CRC surface coils in the array and the volume coil and ii) sensitivity of the CRC coil for reception. The distance between loops of each coil can be optimized according to coil geometry and imaging conditions, for example according to the diameter of loop and the resonance frequency of the coil.

CRC coils of different size can be used in the present invention. As an example, the CRC coils can have a diameter of 7.5 cm and a separation between coils of 12 mm. In another example, the coils can have a diameter of 10 cm and a distance between coils of 9 mm.

In one preferred example, a ratio $Q_U/Q_L$ between the unloaded Q-factor ($Q_U$) and the loaded Q-factor ($Q_L$) of at least 2.0 was demonstrated to be sufficiently large to provide conditions when sensitivity of the CRC surface coil is not compromised as compared to a single-loop surface coil of similar size,
where $$Q_L = \omega_0 \frac{W_t}{P_{sample} + P_{coil}}$$

and $$Q_U = \omega_0 \frac{W_t}{P_{coil}},$$

$\omega_0$ is the resonance frequency, $W_t$ is the total magnetic field energy, and $P_{sample}$ and $P_{coil}$ are sample and coil energy losses, respectively.

Preferably, preamplifier decoupling of the CRC coils provides additional decoupling between surface coils in the array and reduces volume coil radio frequency (RF) magnetic field distortions due to residual volume/CRC coil interaction. For example, the distortion may be reduced to be less than 5% over the entire imaging field.

Preferably, simultaneous reception of the radio frequency magnetic field signal by the surface coil array and by the volume coil results in an increase in signal-to-noise ratio (SNR) up to square root of 2 in areas where the surface coils and the volume coil have similar sensitivity, compared to the SNR obtained by a volume coil or an array in the absence of simultaneous reception. For the surface coil phased array circumscribing a head, the area of similar sensitivity will be near the center of the region that is being imaged.

Preferably, the homogeneity of the transmitted radio frequency magnetic field is improved by simultaneous transmission of the radio frequency magnetic field by the surface coil array and by the volume coil, compared to the homogeneity in the absence of simultaneous transmission. For example, due to RF field/tissue interactions at high magnetic field strengths (4-8 Tesla), the transmit field from head-sized volume coils shows a distinctive pattern of inhomogeneity, with enhanced sensitivity in the center of the brain. Transmit field inhomogeneity is compensated in the present invention by using simultaneous transmission with a volume coil and a CRC phased array.

The invention also provides a radio frequency (RF) system for imaging comprising any of the surface coil arrays disclosed herein and a quadrature volume coil. Different types of quadrature volume coils may be used. Examples include a transverse electromagnetic (TEM) volume coil and a birdcage volume coil (18). The RF system can be used with magnetic fields of different strength, for example between 4 Tesla and 8 Tesla.

The invention also provides a method of imaging a region of a subject comprising simultaneously receiving a radio frequency magnetic field signal by any of the surface coil arrays disclosed herein and by a volume coil. The invention further provides a method of imaging a region of a subject comprising simultaneously transmitting and receiving a radio frequency magnetic field signal by any of the surface coil phased arrays disclosed herein and by a quadrature volume coil. The methods disclosed herein are especially useful for imaging deeper regions of the body, for example brain regions such as central brain regions.

This invention will be better understood from the Experimental Details, which follow. However, one skilled in the art will readily appreciate that the specific methods and results discussed are merely illustrative of the invention as described more fully in the claims that follow thereafter.

EXPERIMENTAL DETAILS

Theory

The intrinsic decoupling of the CRC coil from a homogeneous volume coil and comparison of the CRC coil sensitivity with the sensitivity of the single-turn surface coil of the same size has been discussed previously (7). However, the absence of mutual inductive coupling does not necessarily guarantee the absence of noise correlation (1), which is required for increased SNR during simultaneous reception (8). It has been shown previously that two overlapping vector magnetic field profiles, $B_1$ and $B_1'$, produce no noise correlation if the integral of their scalar product over the entire sample equals zero (13, 14), i.e.

$$\int B_1 B_1' dV = 0 \qquad [1]$$

This is similar to criteria for orthogonality of eigenfunctions (15). Notably this does not require that the two vectors, $B_1$ and $B_1'$, are orthogonal at every single point within the sample. Examples of arrays of orthogonal volume coils placed inside each other and having similar sensitive volumes include: i) a combination of a regular bird cage BC coil with two spiral BC coils having $\pm 2\pi$ rung revolutions along central axis (16) and ii) a combination of two $\pm \pi$ BC volume coils (17).

For a single CRC and a volume coil, Equation [1] can be rewritten as $$\int B_{1CRC} B_{1volume} dV = \int (B_{1CRC}^{top} - B_{1CRC}^{bottom}) B_{1volume} dV = 0, \qquad [2]$$

where $B_{1CRC}^{top}$ and $B_{1CRC}^{bottom}$ are the fields produced by the two loops of the CRC coil. For locations distant from the CRC coil (distances much greater than the distance between the loops), the magnetic fields produced by each loop of the CRC coil are nearly equal in magnitude but opposite in sign and thus cancel each other. However, near the CRC coil the two values differ and give a nonzero contribution to the integral of their product. Decreasing the distance between two loops minimizes this contribution, thereby decreasing the possible noise correlation with the volume coil.

Previously it has been demonstrated at 1.5 T that although the unloaded CRC coil has much lower sensitivity than a single-turn surface coil, when loaded such that sample losses dominate, the CRC and the single-turn coil sensitivities become nearly identical at depths greater than approximately the distance between the two loops of the CRC coil (7). To assess the degree to which sample losses dominate i.e. $P_{sample}/P_{coil}$, where $P_{sample}$ and $P_{coil}$ are sample and intrinsic coil losses, respectively, definitions of the loaded, $Q_L$, and unloaded, $Q_U$, Q-factors can be used, where $$Q_L = \omega_0 \frac{W_t}{P_{sample} + P_{coil}}, \quad [3]$$

and $$Q_U = \omega_0 \frac{W_t}{P_{coil}}$$

where $\omega_0$ is the resonance frequency and $W_t$ is the total magnetic field energy. After simple algebra, one obtains $$\frac{P_{sample}}{P_{coil}} = \frac{Q_U}{Q_L} - 1. \quad [4]$$

The ratio of $Q_U/Q_L$ can be measured experimentally and serves as a parameter that determines the extent of sample loss domination. Decreasing the distance between the loops of the CRC coil decreases noise correlation between the volume coil and the CRC coil. It also improves the isolation between the CRC and the volume coil by decreasing the residual mutual inductive coupling due to inhomogeneity of the volume coil. At the same time, bringing the loops of the CRC coil closer to each other decreases the sample loss contribution, which can compromise the performance of the CRC coil. The CRC coil's $Q_U$ sets a lower limit for the optimal distance between the CRC loops. Thus, minimizing intrinsic coil losses can become an important issue.

Methods

A head-sized 16-element actively detunable quadrature transverse electromagnetic (TEM) volume coil (19, 20) was used for transmission (diameter at the element centers ~31.8 cm, shield diameter ~38 cm, length 23.9 cm). Detailed descriptions of the volume coil design and construction have been described previously (20). Although active detuning of the volume coil is not required for the TEM/CRC array combination, it was included in the coil to enable evaluation of the coil performance with and without simultaneous reception. For comparison purposes all surface coils and phased arrays also had active detuning incorporated into their design so as to allow the volume coil reception efficiency to be used as a reference.

Before constructing the phased array, the performance of the CRC coil was characterized as a function of loop separation by adjusting the distance between the loops. Four CRC coils (8×7.5 cm) with loops separation of 6, 9, 12 and 16 mm were constructed. A conventional single-turn surface coil of the same size was also built for comparison purposes. No preamplifier decoupling was utilized in these surface coils.

A three-channel occipital CRC array was built using 6.4 mm wide copper tape (33). Each surface coil measured 8×7.5 cm and consisted of two octagonal coplanar loops separated by 12 mm. Two loops of the CRC coil were connected in series to produce two currents flowing in opposite direction as shown in FIG. 1. Three capacitors were uniformly distributed over both loops. When placed on acrylic holder of 20.3 cm id with 10 nm distance between the adjacent CRC coils, the array covered an arc of 138°. The intrinsic decoupling between surface coils was 8-9 dB. Using low input impedance preamplifiers (input impedance ~4 Ohm) provided better than 20 dB isolation between the surface coils. Preamplifiers were purchased from Advanced Receiver Research (Burlington, Conn.) and modified as described by Beck et al. (21). Preamplifiers were mounted at the volume coil and were protected during the transmission by active detuning of the surface coils and by cross diodes placed at the preamplifiers' inputs. A schematic of the CRC coil and the matching network connecting each surface coil to the preamplifier is shown in FIG. 1. FIG. 1 depicts a single CRC surface coil and corresponding matching network including preamplifier decoupling schematics. The matching network commonly consists of a lumped element quarter wavelength ($\lambda/4$) transformer (1, 22, 23), which converts the coil resistance to 50 Ohm. Since in the present case the CRC coil resistance at resonance frequency, $R_{CRC}$, is about 3-4 Ohm, the characteristic impedance of the transformer, $Z_0$, should be only about 13 Ohms (1, 24). In this work, the approach of Beck et al. (21) was used to increase the impedance of the $\lambda/4$ transformer and, correspondingly, the values of the inductors. As shown in FIG. 1, three $\lambda/4$ transformers connected in series replace a single lumped element transformer. With impedances of the first and the third transformers ($Z_1$ and $Z_3$) equal to 50 Ohm the impedance of the central transformer, $Z_2$, can be calculated as $Z_2=(Z_1 Z_3)^2/Z_0 \approx (50)^2/13 \approx 200$ Ohm. Tri-axial baluns were used for each channel to prevent shield currents. PIN diode (MA4P4006, M/A-COM, Lowell, Mass.) detuning circuits were incorporated into each CRC coil to protect preamplifiers during the transmission and to enable comparison of coils' sensitivities with and without simultaneous volume/surface coil reception. For active detuning of each CRC surface coil PIN diode traps were used as shown in FIG. 1 (20, 23). The coil is decoupled when a high-impedance resonance trap, formed by the $\lambda/4$ transformer and the forward driven PIN diode is introduced in series with the surface coil. A homebuilt PIN diode driver provided direct current of 70 mA per diode and a negative bias of 90V.

Figure 2A:
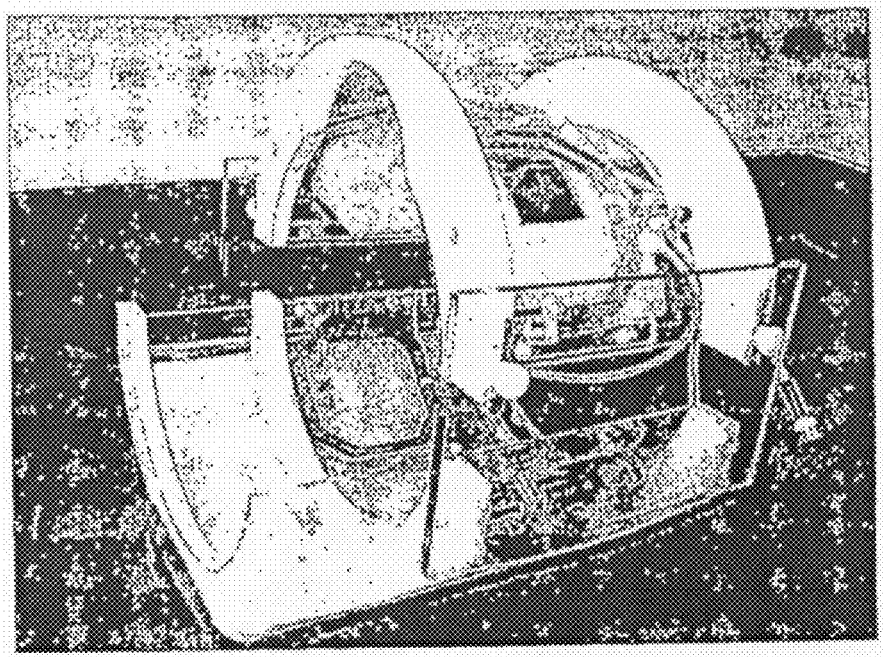
FIG. 2A-2B. Views of (A) the four-channel CRC phased array circumscribing a human head and (B) the same phased array assembled together with the head-sized TEM volume coil for simultaneous use during transmission and reception.
Figure 2B:
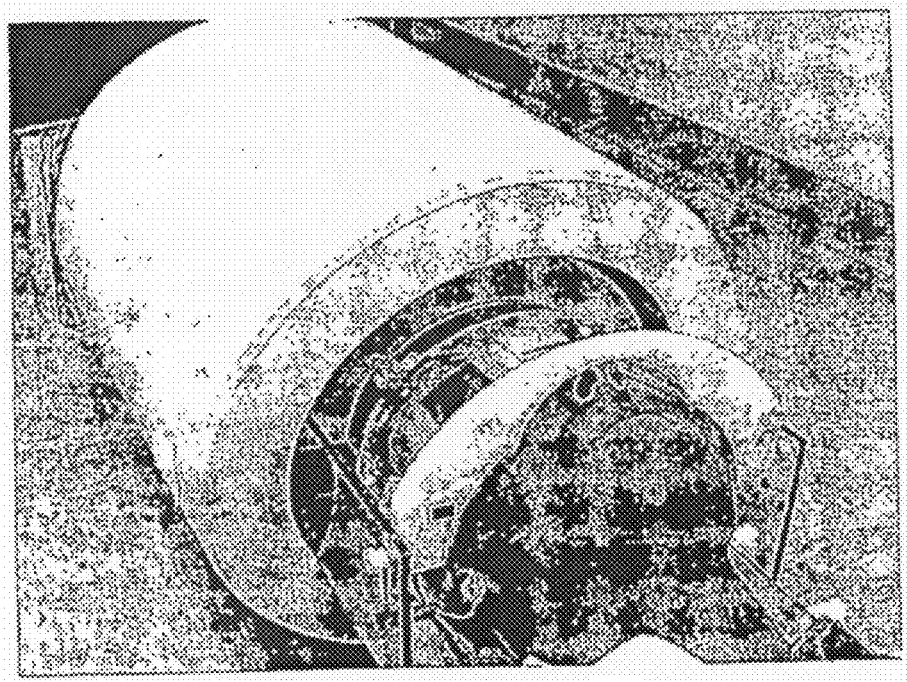

A phased array circumscribing the head consisting of four 9×10 cm CRC surface coils is shown in FIG. 2. Each CRC coil was actively detuned and driven as depicted in FIG. 1. To provide better fit and to optimize the CRC array performance, the 20.3 cm (outside diameter) coil holder was split in two halves with the position of the top portion being adjustable vertically (FIG. 2A). The performance of the four-channel CRC phased array was compared to the receive-only array of regular single-loop surface coils of the same size and geometry. Adjacent coils were inductively decoupled and each coil was individually tuned and matched. No preamplifier decoupling was employed in this design.

The noise correlation function was measured for all of the coils. Noise images were obtained by acquiring the images without a RF pulse. For phantom imaging a 2 L (16 cm OD)) spherical "head phantom" filled with 50 mM NaCl (conductivity ~0.65 S/m) was used.

All data were acquired with a Varian INOVA 4T (170 MHz) whole-body system (Palo Alto, Calif.). Gradient echo images of phantoms were obtained with 128×128 resolution. Anatomical images were acquired using an inversion recovery gradient echo sequence (TE/TIR/TR 14.5/850 12500 ms) with a matrix size of 256×256, a FOV of 192×192 mm and a slice thickness of 1.5 mm.

Results and Discussion

Performance of the Volume Coil. The performance of the quadrature TEM volume coil was compared with other volume coils. The TEM coil generated a circular polarized RF magnetic field $B_1$ of 1 kHz (or 23.5 µT) in amplitude in the central transaxial slice of a human head using 1 kW RF. This is similar or better than previously reported for an actively detunable quadrature TEM head volume coil of similar size (diameter at the element centers ~32 cm, shield diameter ~38 cm, length 25 cm) that provided 300 µs 90° pulse in the central transaxial slice of the head using 1 kW RF power (19). This corresponds to the $B_1$ field amplitude of 0.84 kHz (or 20 µT). The effectiveness of the quadrature TEM volume coil in producing circular polarized RE magnetic field was evaluated using a $B_1$ mapping method (25). Measurements were performed with the CRC array positioned inside of the volume coil. The ratio of the $B_1^+$ and $B_1^-$ components of the circular polarized magnetic field rotating clockwise and counter clockwise, respectively, was better than 10 dB over the entire human head and measured 14 dB in the brain center. This indicates that the average loss of the amplitude of the transmit $B_1^+$ field due to the contribution of the $B_1^-$ component was less than 5%.

Figure 3A:
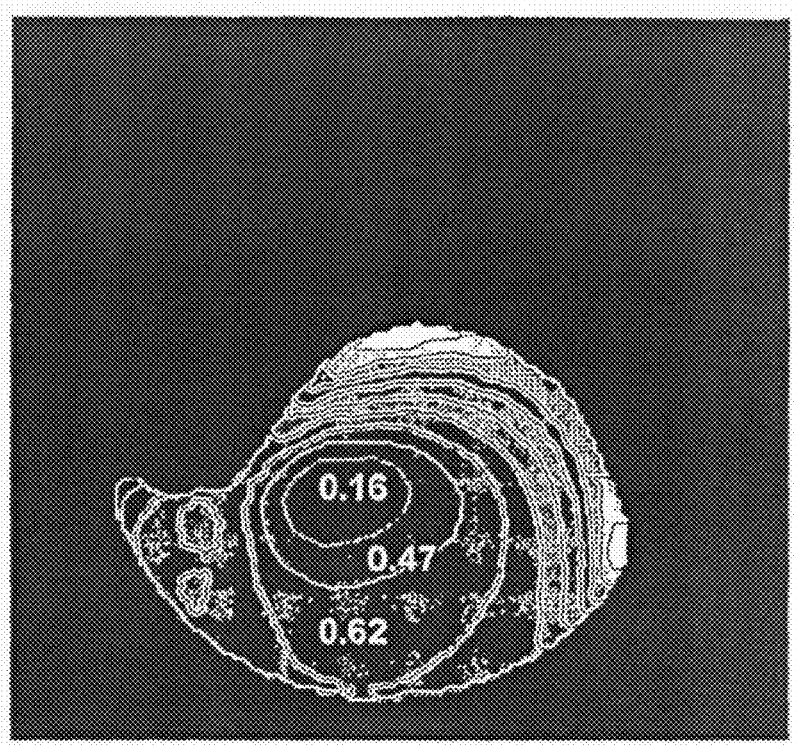
FIG. 3A-3C. Performance of a conventional single-turn surface coil used for simultaneous reception with a volume coil. A) The map of the ratio of regular single-turn surface coil gradient echo phantom images obtained during the volume/surface coil simultaneous reception and with the volume coil detuned during the reception. B) The central vertical plots of the surface coil images obtained during the volume/surface coil simultaneous reception (dashed line) and with the TEM volume coil detuned (solid line). C) The map of the ratio of TEM volume coil images obtained during the volume/surface coil simultaneous reception and with the surface coil detuned.
Figure 3B:
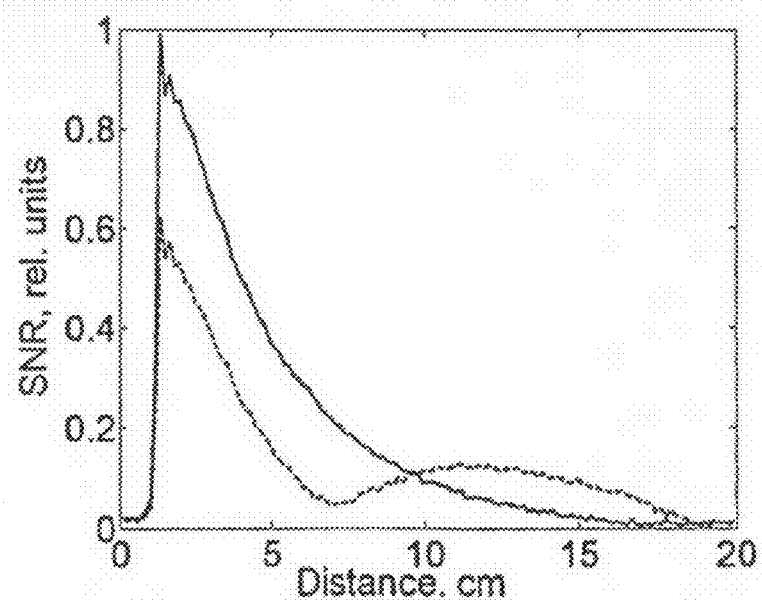
Figure 3C:
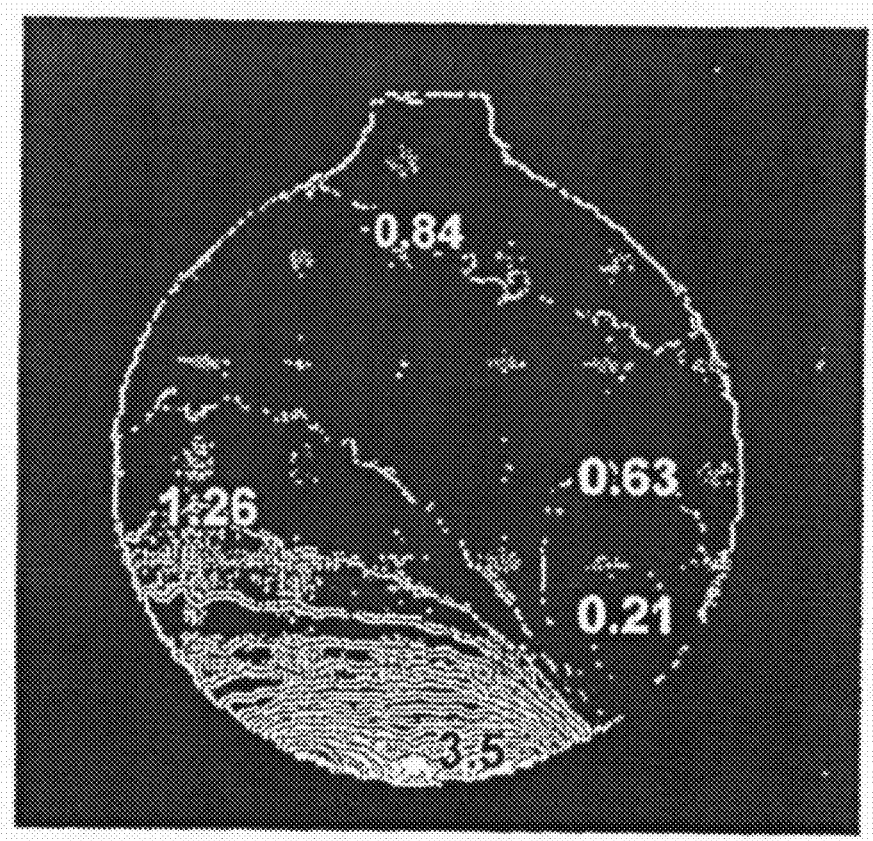

Performance of Conventional Single-Turn Surface Coils when Used for Simultaneous Reception. To provide a basis for direct comparison of the performance with the CRC coils, the loss in sensitivity for a volume and a conventional surface coil were evaluated when a 7.5×8 cm single-turn surface coil was placed inside of the TEM volume coil and both coils were used simultaneously for reception. FIG. 3 shows data obtained from a phantom mimicking a head load using this coil configuration. FIG. 3A displays the ratio of the surface coil images obtained with and without simultaneous reception from the TEM and surface coil. The sensitivity of the surface coil is decreased by approximately 40% near the coil. FIG. 3B shows two central plots obtained from surface coil images recorded using volume/surface coil simultaneous reception (dashed line) and with the TEM coil detuned (solid line) during reception. Similarly, the field profile of the volume coil was altered when both coils were used simultaneously. FIG. 3C plots the ratio of TEM volume coil images obtained with and without simultaneous reception. In this case the volume coil sensitivity profile is also disturbed both near the surface coil and at distant locations. Using preamplifier decoupling of the surface coil substantially improved the volume coil sensitivity profile but essentially did not change the surface coil field profile. The noise correlation measurements revealed substantial mutual inductive coupling between the volume and the surface coils, which manifested in a large (~0.3-0.4) value of the imaginary part of the noise correlation function. The resistive component was about 0.1. However, even if the noise correlation had been negligible, the mutual inductive coupling of the coils still compromised the sensitivity of the surface coil, thus reducing the advantage of simultaneous reception with conventional single turn surface coils.

Figure 4A:
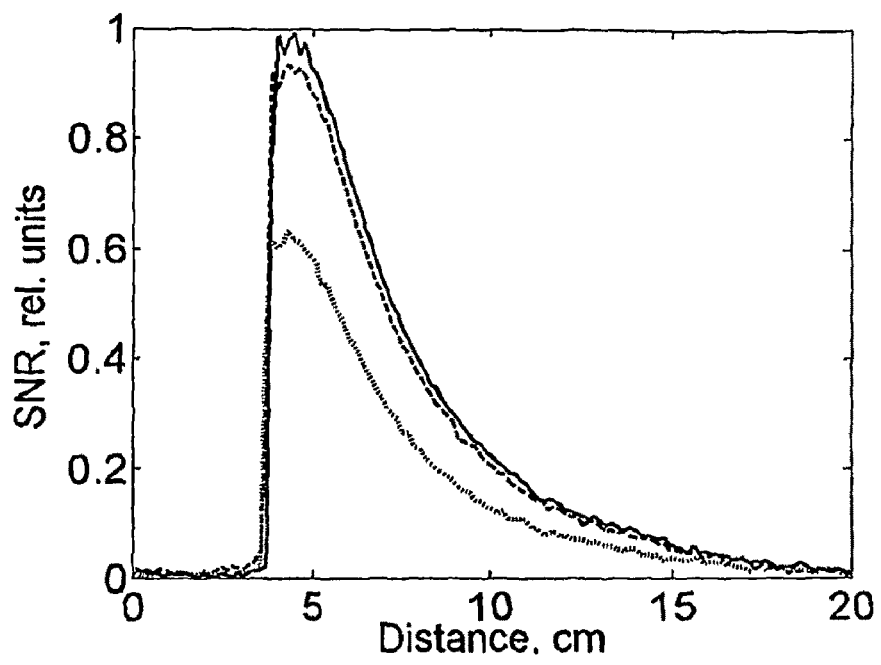
FIG. 4A-4B. CRC coil performance. A) Central vertical plots of gradient echo phantom images obtained using 7.5×8 cm CRC coils with different distances between the loops. Distance between loops=12 mm (solid line), 9 mm (dashed line), 6 mm (dotted line). B) Central plots of the phantom images obtained by the CRC coil (solid line) and the regular single-turn surface coil (dashed line) of the same size. The inset in B) shows an expanded view of the initial portion of the larger plot.

CRC Coil Performance. To optimize the performance of the individual CRC coils, a comparison was made of 4 coils with loop sizes of 8×7.5 cm and loop spacings of 6, 9, 12 and 16 mm. FIG. 4A shows the central plots of phantom images obtained using these coils in receive-only mode with the volume coil detuned during the reception. The phantom was positioned 1.5 cm away from the coils to mimic experimental conditions for brain imaging. Table 1 provides the measured values for isolation between the volume and the CRC coils, the $Q_U$ and the $Q_U/Q_L$, which characterizes the sample loss contribution. Since increasing the $Q_U$ increases the $Q_U/Q_L$, as well as relative contribution of the sample losses, its optimization becomes an important issue. This was achieved by minimizing the number of distributed capacitors and using high-Q inductors in the matching network (FIG. 1). As seen from Table 1, the $Q_U$ value of the CRC coil decreased with decreasing the distance between the loops. The $Q_U$ of the conventional single-turn surface coil measured 350, which was the same as the Q-value of the CRC coil with 16 mm loop spacing and only slightly larger than that of the CRC coil with a 12 mm spacing. Decreasing the distance between the loops improves isolation but at the same time decreases the sample loss contribution. For $Q_U/Q_L$ less than 2 the coil performance decreased substantially (FIG. 4A). The coil with a loop spacing of 6 mm and $Q_U/Q_L$ equal to 1.6 performed about 40% worse than the CRC coil with a loop spacing of 12 mm, while the coil with a loop spacing of 9 mm, which provided $Q_U/Q_L$ equal to 2, was only slightly worse. The performance of the coil with a loop spacing of 16 mm (not shown) was the same as the coil with 12 mm loop spacing. Thus a $Q_U/Q_L > 2$ (or $P_{sample} \geq P_{coil}$) for an 8×7.5 cm CRC coil appears to be optimal.

TABLE 1

Dependence of the loaded Q-factor, $Q_L$, and the isolation between the volume and the CRC coils on the distance between two loops of the CRC coil.

| Distance between loops (mm) | $Q_U$ | $Q_U/Q_L$[a] | Isolation, dB[b] |
| --- | --- | --- | --- |
| 16 | 350 | 3.1 | −15 |
| 12 | 340 | 2.6 | −18 |
| 9 | 305 | 2 | −19 |
| 6 | 275 | 1.6 | −21 |

[a]CRC coils were loaded with a 2.0 L spherical phantom located at ~1.5 cm distance from the coil surface.
[b]Isolation was measured between CRC and the quadrature TEM coils with the 90°-hybrid installed.

Figure 4B:
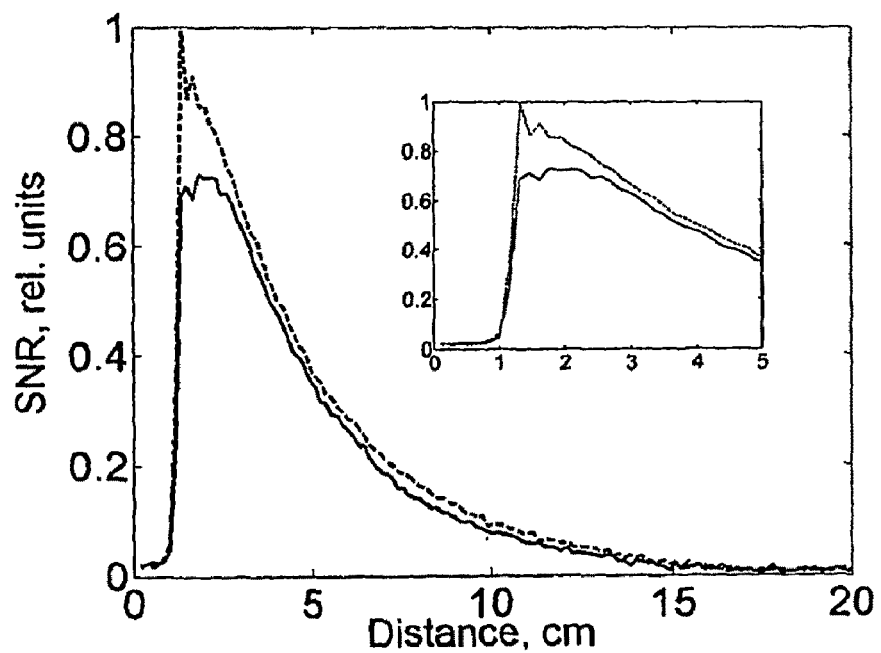
Figure 5A:
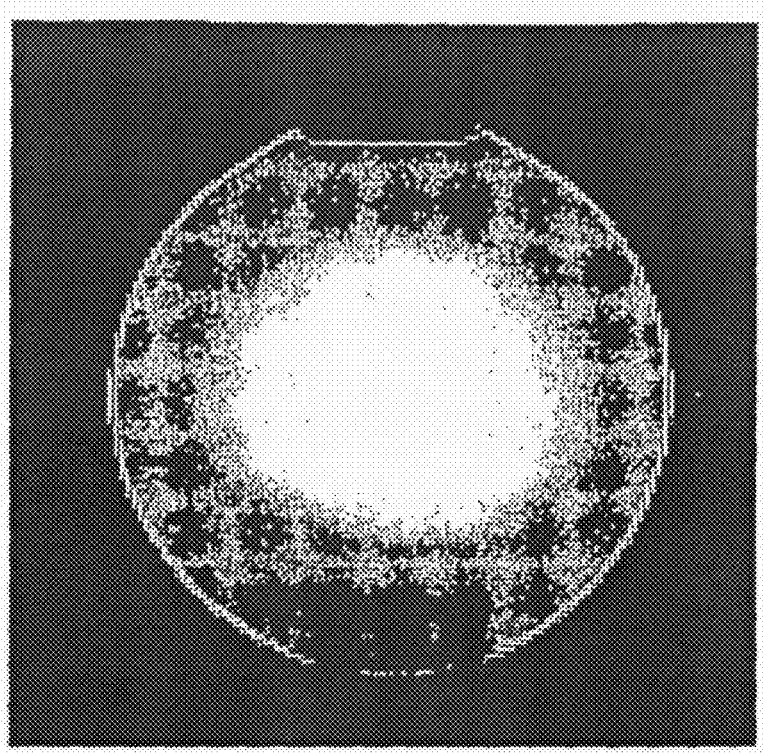
FIG. 5A-5E. Imaging data for a phantom mimicking the load of a head during simultaneous reception using the TEM volume coil and CRC coil. Gradient-echo phantom images from the TEM coil obtained during the TEM and the CRC coil simultaneous reception without (A) and with preamplifier decoupling (B). C) Central vertical plots of volume coil images shown in (A) (dashed line) and (B) (solid line). D) The map of the ratio of the CRC coil gradient echo images obtained during the volume/surface coil simultaneous reception and with the volume coil detuned during the reception. E) Central plots of the CRC coil phantom images obtained with the TEM coil detuned (solid line) and during the CRC/TEM simultaneous reception (dashed line).
Figure 5B:
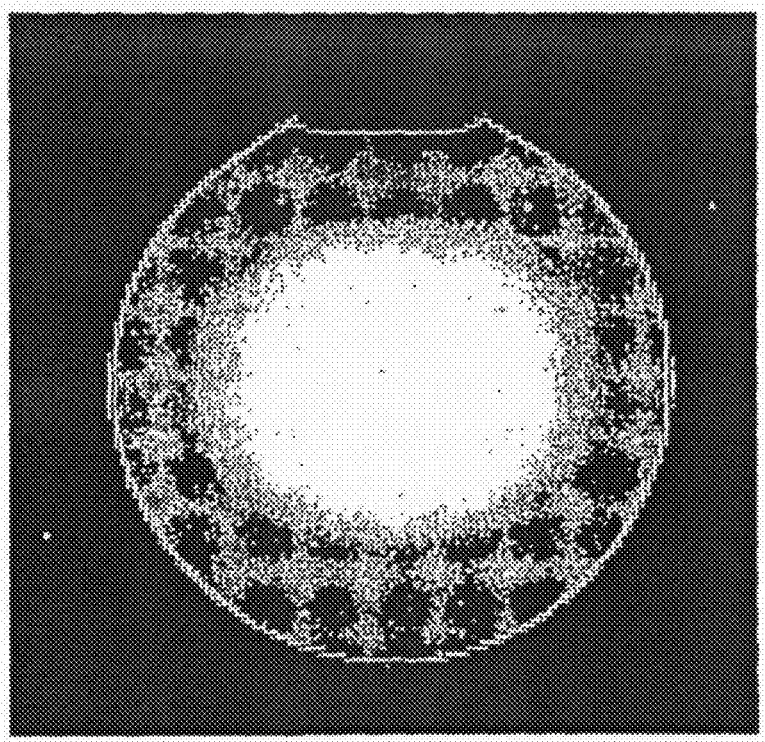
Figure 5C:
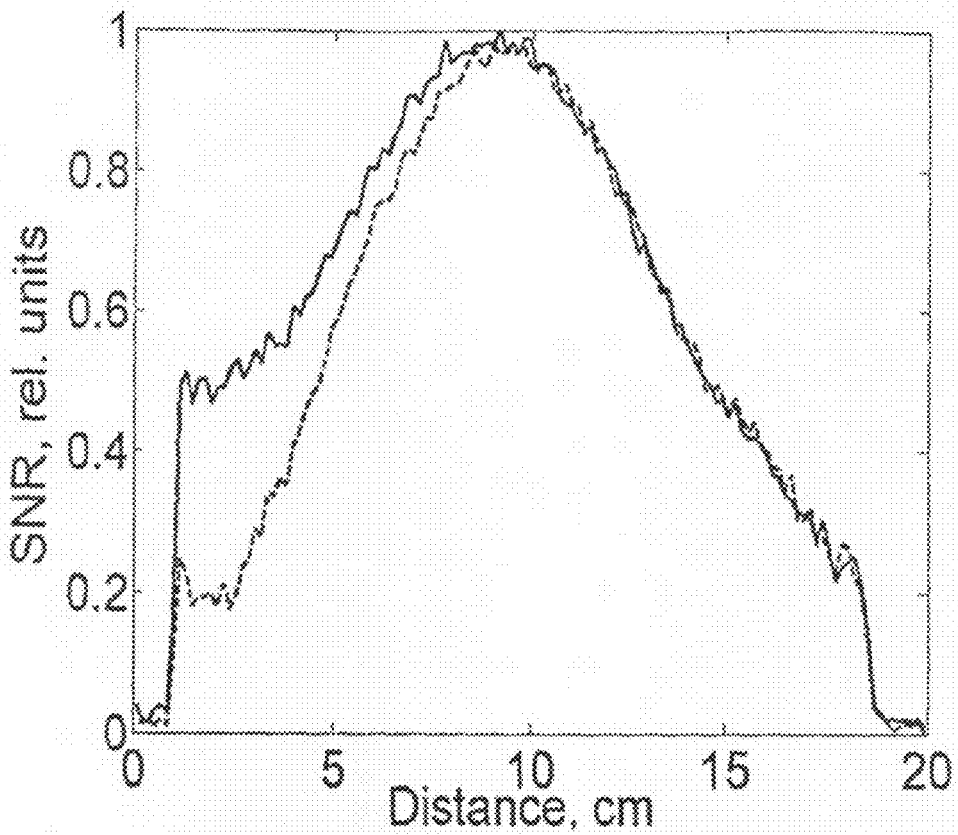
Figure 5D:
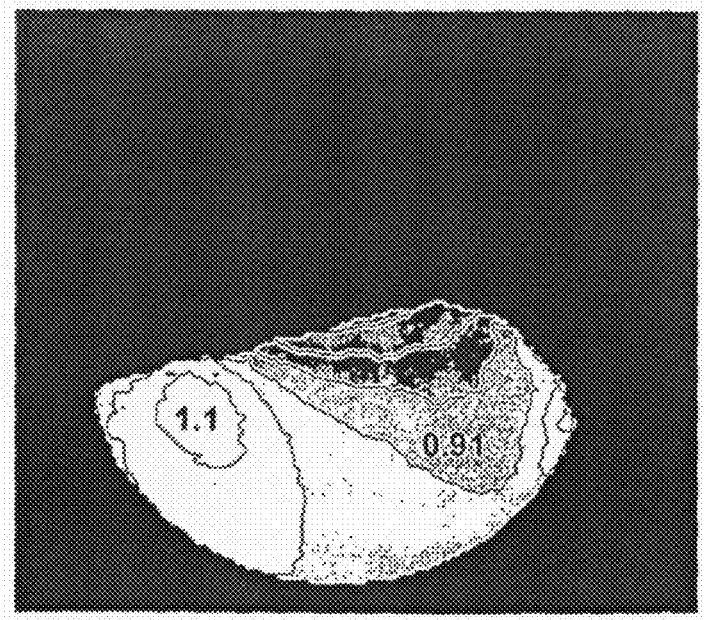
Figure 5E:
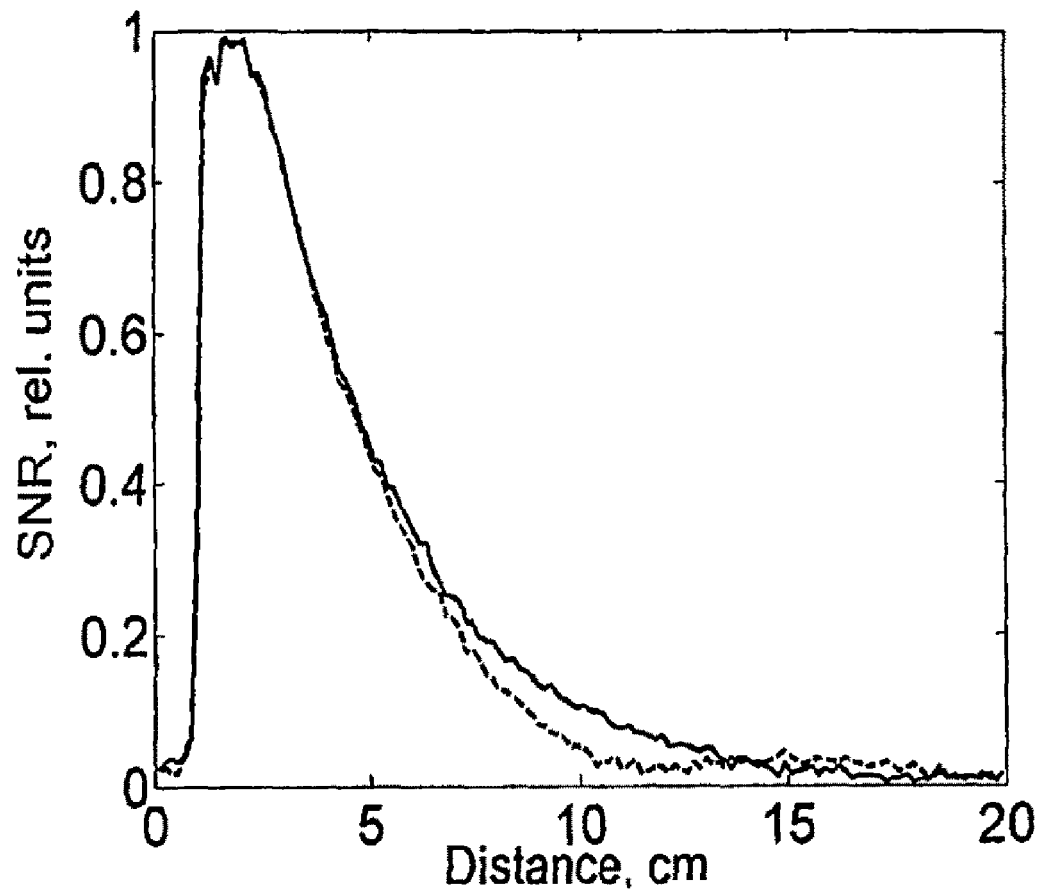

The sensitivity of the CRC coil was also compared to the regular single-loop surface coil of the same size. FIG. 4B shows the central plots of phantom images obtained using the regular single-turn surface coil and the CRC coil with 12 mm distance between the loops. The CRC coil sensitivity was lower than that of the regular surface coil at the depths less than 2 cm. At greater depths both coils had similar sensitivities. The decrease in sensitivity immediately adjacent to the CRC coil can be advantageous for human brain spectroscopic studies since contamination arising from the scalp and muscle can be decreased. The intrinsic isolation between the volume coil and CRC coil varied from about 15 dB for the coil with a 16 mm loop separation to about −22 dB for the coil with a 6 mm loop separation. For these reasons, the CRC coil with 12 dB distance between the loops was chosen, which provided isolation of about −17 to −18 dB but did not significantly compromise the coil performance. This is in contrast to the less than −10 dB of isolation between the volume coil and a regular single-turn coil of the same size that leads to substantial distortions of $B_1$ field profiles from both the surface coil and the volume coil (FIG. 3).

At higher fields when sample loss contribution becomes greater or under experimental conditions, which allow decreasing the distance between the coil and the sample thereby increasing the $Q_U/Q_L$ ratio (or sample loss contribution), CRC coils with smaller distances between the loops can be utilized.

FIG. 5 displays imaging data for a phantom mimicking the load of a head obtained during simultaneous reception using the TEM and the CRC coil (12 mm loop separation). As seen from FIGS. 5A-5C, the $B_1$ profile of the volume coil was substantially altered near the CRC coil up to a depth of ~5 cm. However, preamplifier decoupling of the CRC coil minimized the TEM coil $B_1$ field distortions making them less than 5% over the entire FOV (FIG. 5B). FIG. 5D displays the ratio of the CRC coil images obtained with and without simultaneous reception from the TEM and the CRC coil. The sensitivity of the CRC coil was altered by less than 10% near the coil (FIG. 5D) with a small decrease in the sensitivity at ~9-10 cm depth (FIG. 5E). Noise measurements did not reveal any substantial correlation (<0.05) between the volume and the CRC surface coils.

Figure 6:
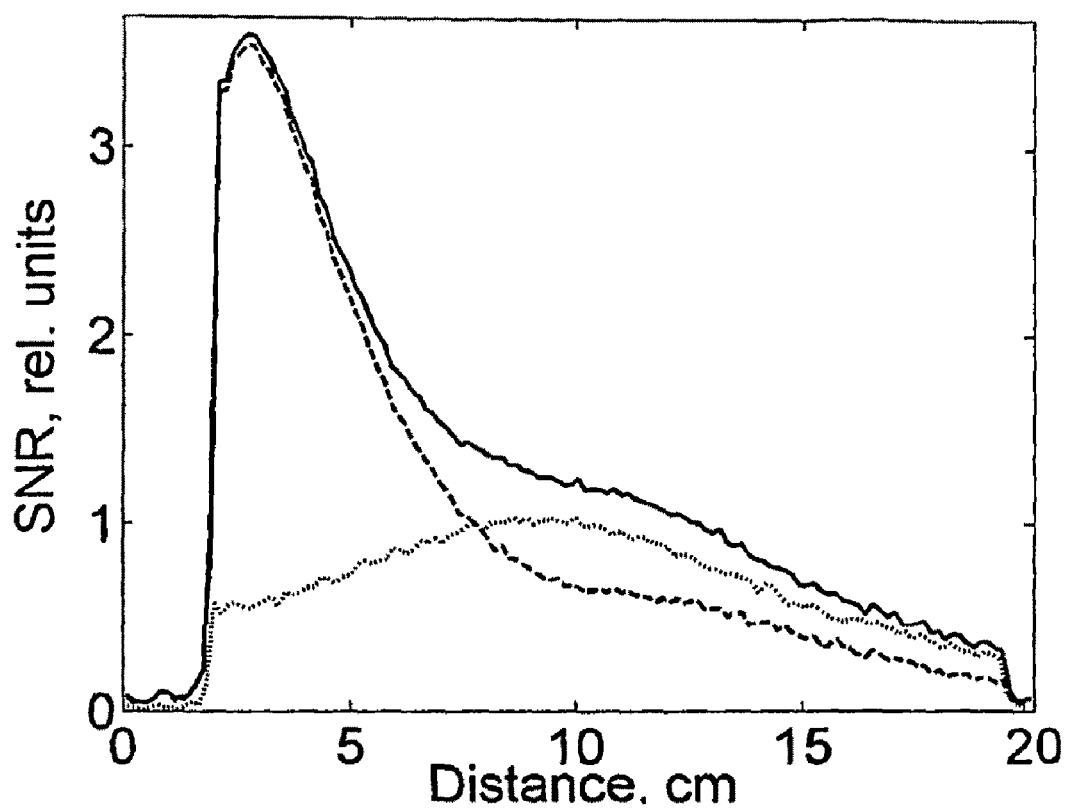
FIG. 6. Central vertical plot of phantom images from the TEM coil (dotted line) and the CRC array (dashed line) as well as their sum-of-squares (SoS) combination (solid line) obtained during the TEM volume coil and the CRC array simultaneous reception.
Figure 7A:
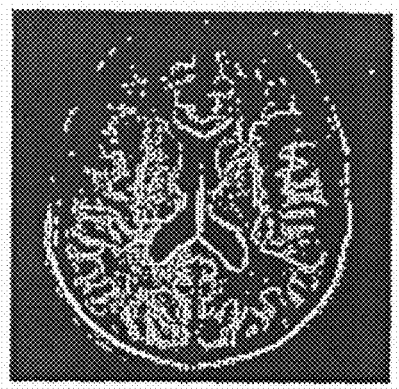
FIG. 7A-7E. Human head images from the TEM (A) and individual CRC surface coils (B-D) obtained during the TEM volume coil and the three-channel occipital CRC array simultaneous reception. E) SoS combined image.
Figure 7B:
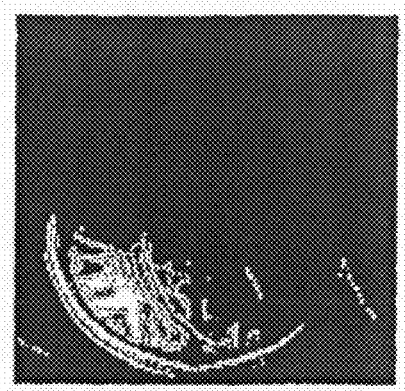
Figure 7C:
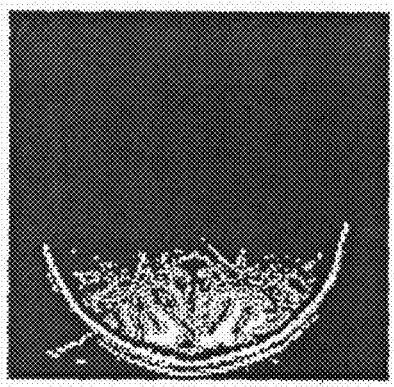
Figure 7D:
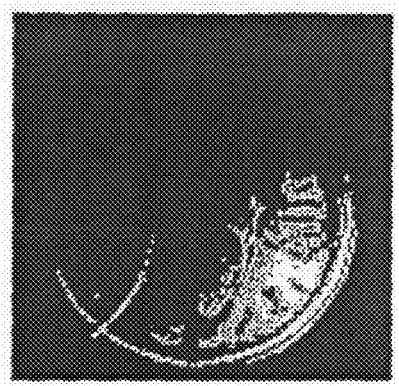
Figure 7E:
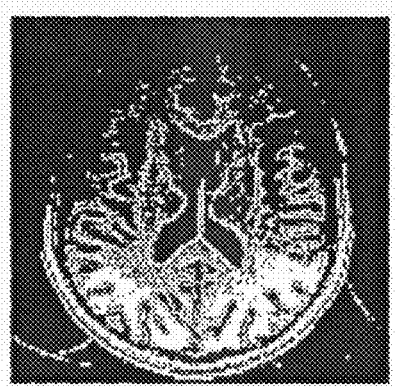

Performance of the Occipital Array and Simultaneous Reception. FIG. 6 shows the central plots of phantom images obtained simultaneously by the TEM volume coil and the occipital three-channel CRC array as well as the plot of their sum-of-square (SoS) combination (1). This figure demonstrates a 40% increase in the SNR at about 8 cm depth near the phantom center. FIG. 7 displays human head images also obtained during simultaneous reception with the TEM volume coil and the occipital CRC array. All images are displayed using the same intensity scale to demonstrate the improvement in SNR from deeper structures within the brain due the volume coil/CRC array simultaneous reception. The noise correlation between the volume and the surface coils was measured to be less than 0.1 in agreement with the phantom data.

Figure 8:
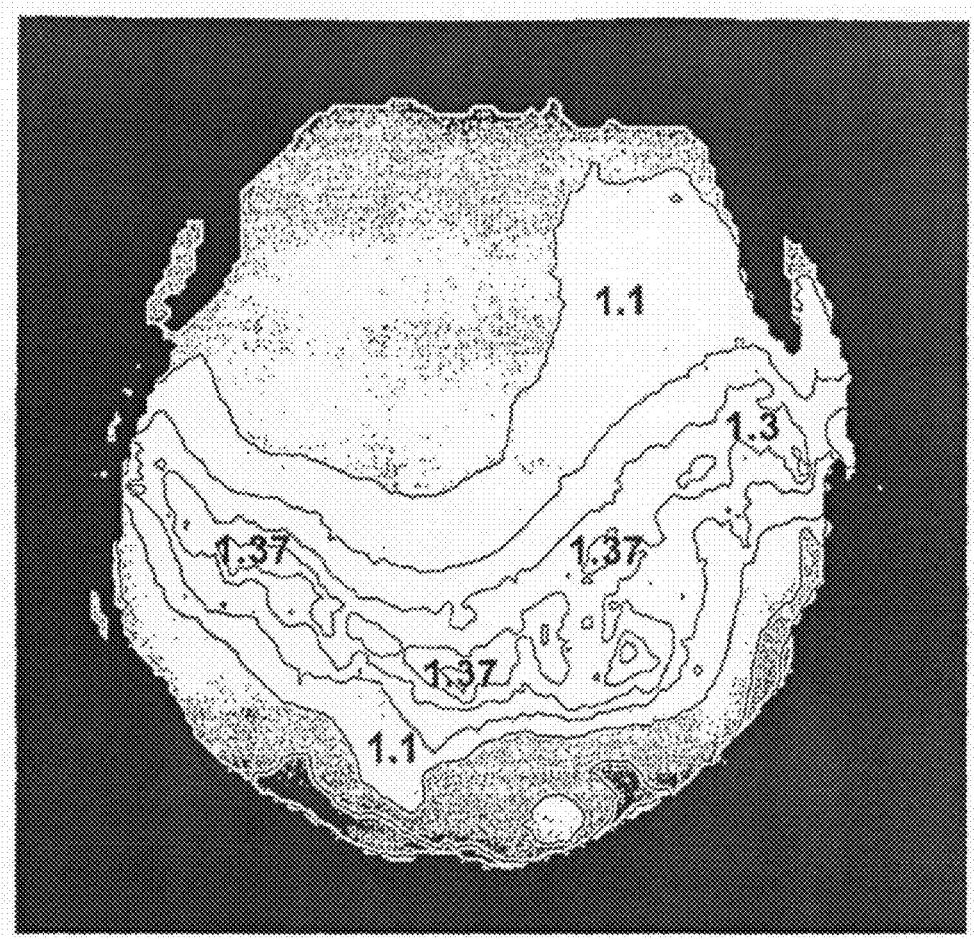
FIG. 8. Improvement of SNR in the SoS-combined image, shown in FIG. 7E, calculated at each point as a ratio of the SoS SNR to the largest SNR between two of the coils (either TEM or the occipital CRC array).

FIG. 8 shows the map of the SNR improvement in the SoS combined image calculated at each point as a ratio of the SoS SNR to the largest SNR from either of the two coils used independently (either TEM or the CRC array). Similar maps were obtained with the head phantom. About 40%. SNR improvement near the head and phantom centers was achieved.

Performance of Circumscribing CRC Array and Simultaneous Reception. To evaluate if the sensitivity of the phased array from central brain regions was not compromised by the use of CRC coils, and provide the reference for quantitative analysis of the CRC array performance, performance was first evaluated for the four-channel receive-only array of conventional single-turn surface coils of the same size and geometry. The SNR of the array of four 9×10 single-turn surface coils, measured in the center of the head, was about 10% better than the TEM volume coil.

Figures 9A, 9B, 9C, 9D, 9E, 9F:
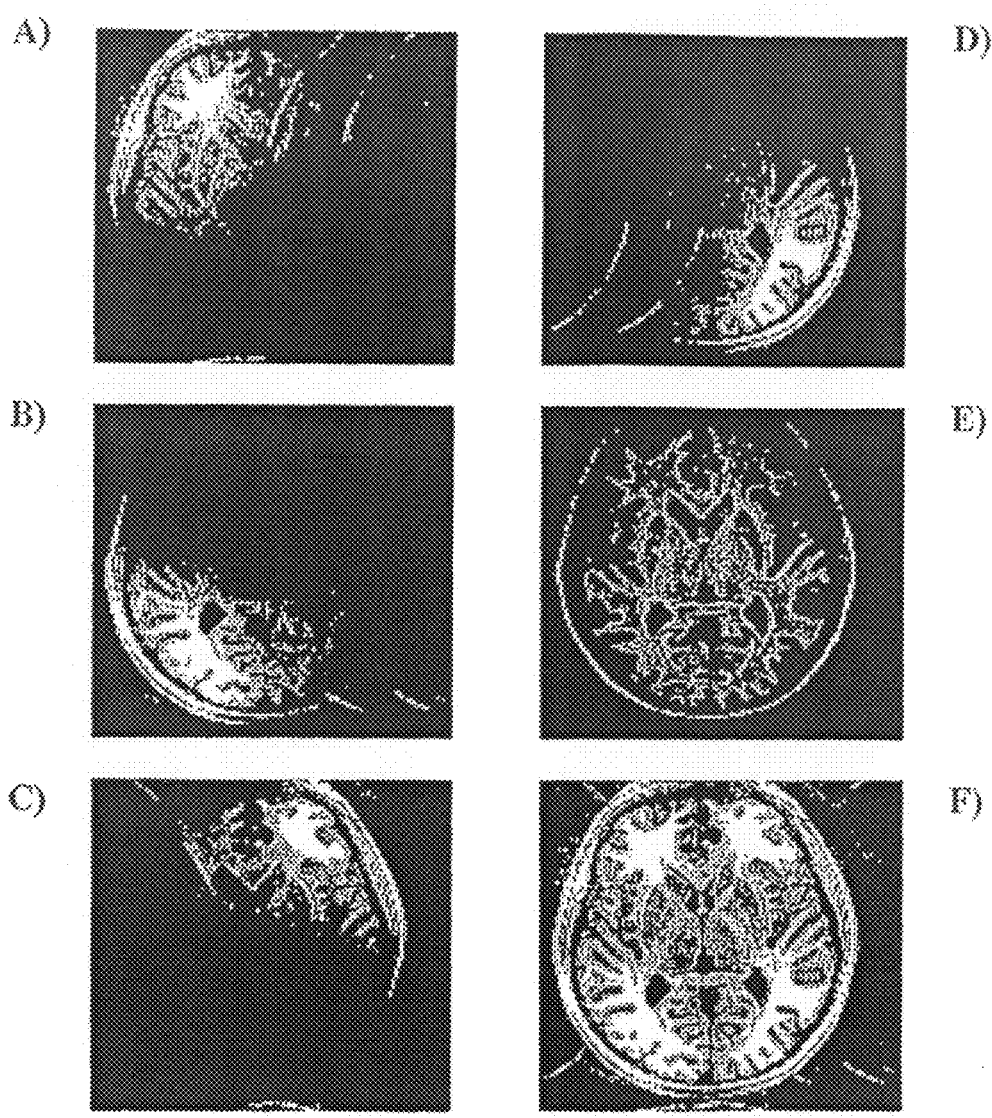
FIG. 9A-9F. Human head images from individual CRC surface coils (A-D) and the TEM volume coil (E) obtained during the TEM/four-channel CRC array simultaneous reception. F) SoS-combination of all five images.

Simultaneous reception was evaluated using a circumscribing array of four 9×10 cm CRC coils (FIG. 2) uniformly distributed around the head to optimize the SNR of the phased array at the center of the brain. FIG. 9 depicts a human head image obtained by TEM and each CRC coil during simultaneous volume coil/array reception as well the SoS-combination of all five images. All images are displayed using the same intensity scale to demonstrate the improvement in peripheral SNR as well as SNR enhancement near the head center. The noise correlation between all the CRC coils in the array as well as between the CRC and the TEM coil was measured to be less than 0.1 in agreement with predictions.

Figures 10A, 10B:
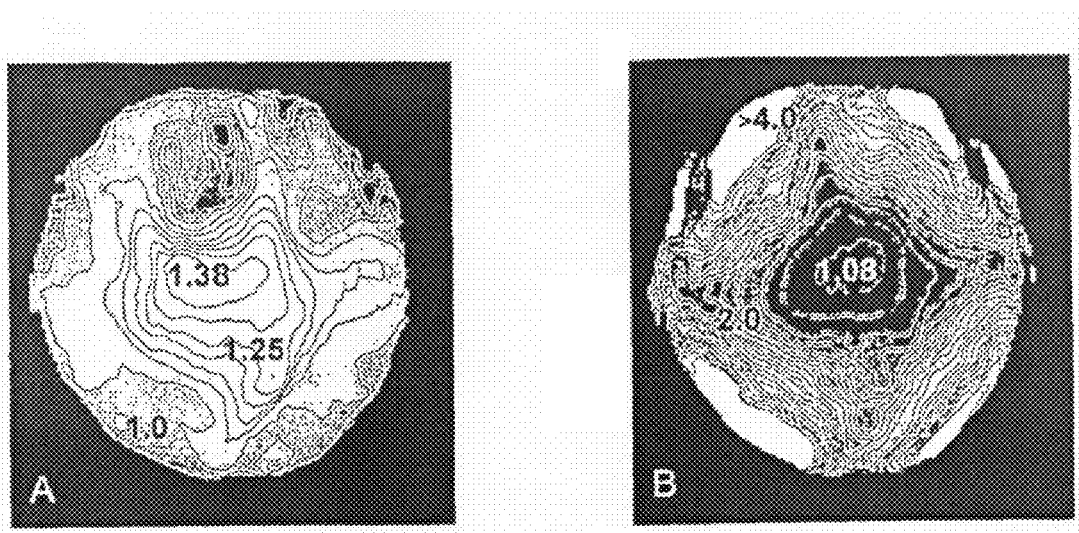
FIG. 10A-10B. Improvement in SNR obtained by simultaneous reception with four-channel CRC array and the volume coils. A) Improvement of SNR in the SoS combined image calculated at each point as a ratio of the SoS SNR to the largest SNR between two of the coils (either TEM or the CRC array). B) The map of the ratio of the four-channel CRC array SNR to the SNR of the TEM coil.

FIG. 10A shows the improvement in SNR obtained by simultaneous reception with the array and volume coil calculated as a ratio of the SoS SNR to the largest SNR of the coils individually (either TEM or the CRC array). About 40% improvement was obtained near the center of the head. FIG. 10B presents a map calculated as a ratio of the SNR of the CRC array to the SNR of the TEM coil. At the center of the head the CRC array was slightly (8%) more effective than the TEM coil. The SNR of the array of four single-turn surface coils, measured in the center of the head, was only marginally better (less than 5%). This again confirms the observation that when sample loss dominates, the CRC array provides very similar performance to that of an array of single-turn coils.

Simultaneous Transmission with the CRC Array and a Volume Coil. Due to RF field/tissue interactions at high-field (4-8T), the transmit field from head-sized volume coils shows a distinctive pattern of inhomogeneity, with enhanced sensitivity in the center of the brain. Transmit field inhomogeneity was compensated in the present study by using simultaneous transmission with a volume coil and a CRC phased array. Since phased array provides higher peripheral sensitivity than a volume coil (FIG. 10B), a smaller amount of power directed into the CRC array during transmission will enhance the peripheral RF magnetic field improving overall homogeneity.

Figure 11:
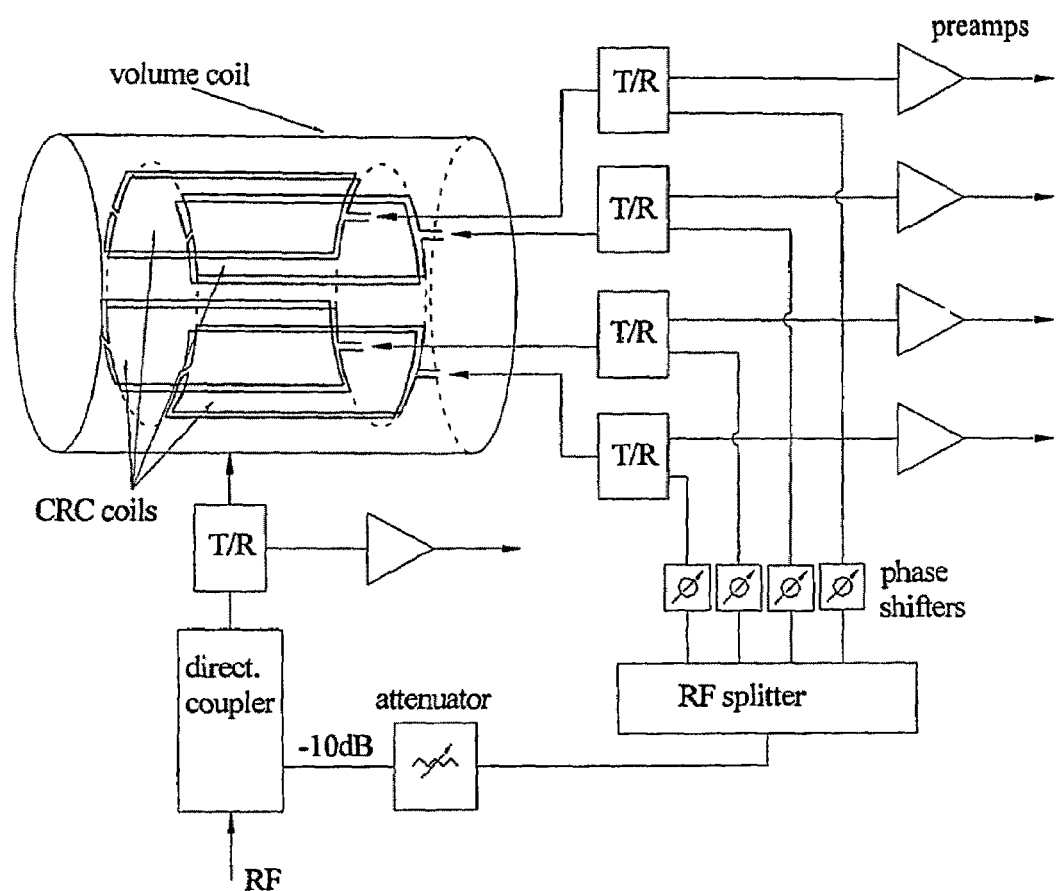
FIG. 11. Schematic of the simultaneous transmission and reception with a CRC phased array and a volume coil.

FIG. 11 presents a schematic of the simultaneous transmission and reception with a CRC phased array and a volume coil. For simplicity, only four CRC coils are shown in the figure. Increasing the number of coils will further improve peripheral homogeneity. During transmission, some amount of the RF power is directed into the CRC phased array using a directional coupler. If required, a variable attenuator provides further attenuation. A four-way splitter delivers equal amount of power to each CRC coil in the array. Phase shifters provide proper summation of RF magnetic fields created by each individual surface coil to produce a circularly polarized field. During reception, signals from all the CRC surface coils and the volume coil are directed to preamplifiers through TIR switches (FIG. 11), which also protect preamplifiers during transmission.

The intrinsic decoupling between surface coils loaded with a head or a phantom was better than −20 dB. Low input impedance preamplifiers (input impedance ~4Ω) were used to optimize the system performance. The intrinsic isolation between the volume and CRC coils was better than −17 dB. During transmission, the RF power was split in between the TEM and the phased array. The phases of RF were adjusted so as to provide 0°, 90°, 180°, and 270° phase shifts at the corresponding coils in the array. The phase shift between the TEM and the array was adjusted using a cylindrical phantom and a pickup coil to provide proper summation between circularly polarized fields created by the array and the volume coil. The transmission network consisted of a four-way splitter and four T/R switches, enabling delivery of RF power to the array during transmission and connection of the surface coils to the preamplifiers during reception. This enables both simultaneous transmission and reception with the CRC array and the TEM volume coil.

Figures 12A, 12B:
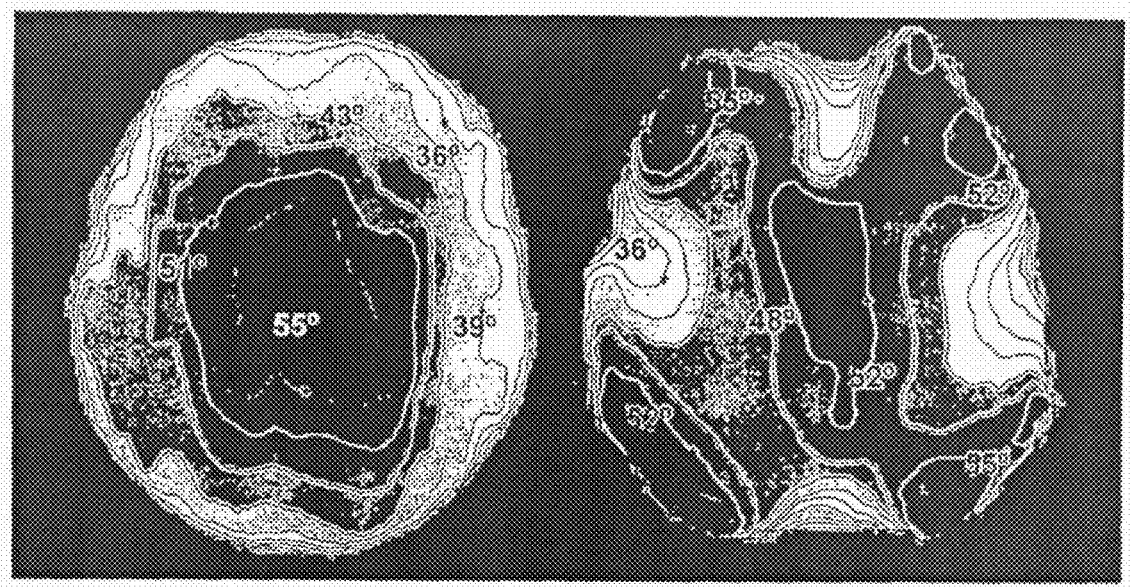
FIG. 12A-12B. Transmit $B_1$ field improvement obtained for a human head during simultaneous transmission from the volume coil and the four-channel CRC array. A) Transmit $B_1$ field obtained by the TEM volume coil alone. B) Transmit $B_1$ field obtained with simultaneous transmission from the volume coil and the array using a transmit power ratio of 2:1.
Figures 13A, 13B:
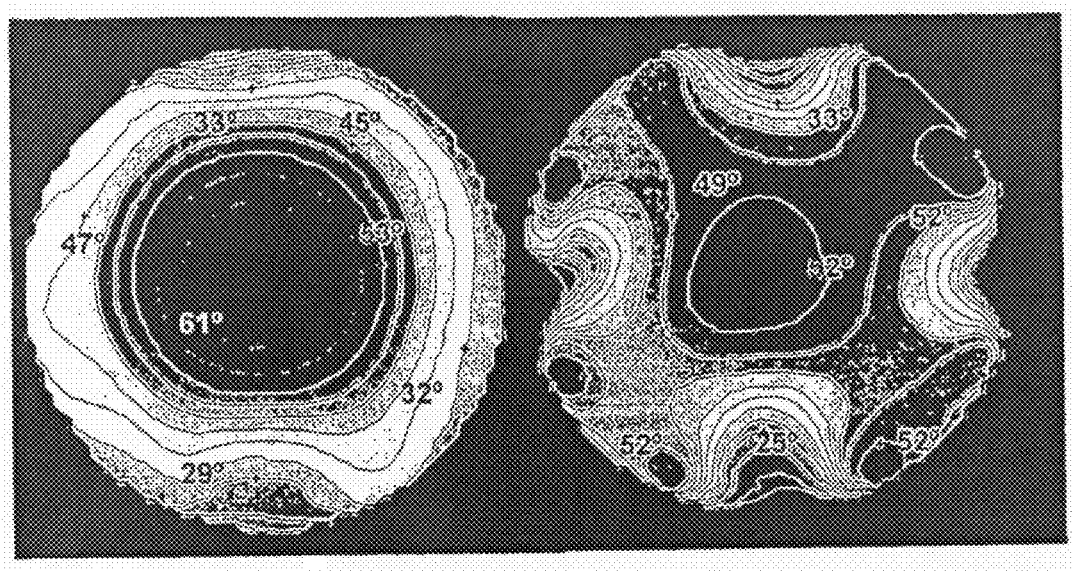
FIG. 13A-13B. Transmit $B_1$ field improvement obtained for a 3 L phantom with simultaneous transmission from the volume coil and the four-channel CRC array. Conditions mimic those seen in the human head at higher field strength of 7T. A) Transmit $B_1$ field obtained by the TEM volume coil alone. B) Transmit $B_1$ field obtained with simultaneous transmission from the volume coil and the array using a transmit power ratio of 1:1.

FIG. 12 shows the transmit $B_1$ field obtained at 4 T by the TEM volume coil alone (FIG. 12A) and with simultaneous transmission from the volume coil and the array (FIG. 12B) using a transmit power ratio of 2:1 between the volume coil and the array, respectively. The transmit $B_1$ field is substantially more homogeneous than that obtained by the volume coil alone in the regions covered by the array. Increasing the number of CRC coils to 8, or increasing the diameter of the existing 4 coils would eliminate the residual low $B_1$ regions seen between the coils. To mimic conditions seen at the higher magnetic field of 7 T in the human head, where the $B_1$ varies by more than 75% (26), a large 3 L spherical phantom was used (o.d. 21.5 cm, filled with 50 mM NaCl). RF power was split in a 1:1 ratio between the TEM and the phased array. Again, the transmit $B_1$ field obtained using the TEM and the CRC array simultaneously (FIG. 13B) was more homogeneous than that obtained by the TEM coil alone. Additionally, the power required to achieve an average rotation of 90° across the head was the same either during simultaneous transmission or using the TEM coil alone.

Previously, RF field inhomogeneity corrections at high magnetic fields (above 4 T) have been demonstrated by using phased arrays (18) or multi-port driven volume coils (32). These methods improve RF field homogeneity due to combining a second commonly used mode with higher order modes, which are intrinsically characterized by a substantial level of phase nonuniformity. This results in peripheral phase distortion. Conversely, in the method disclosed herein, the TEM and phased array have similar phase distributions but different spatial profiles. For that reason addition of two RF fields does not alter the peripheral phase distribution.

CONCLUSIONS

Phased arrays can provide enhanced SNR for peripheral brain regions in comparison to volume coils. However, due to the $B_1$ profile of the array, the improvement in SNR is often minimal at the center of the head. This limitation can be overcome if both the volume coil and the array can be used for simultaneous reception. Due to the strong interaction between conventional single-loop surface coils within the array and the volume coil, and the resulting distortion in $B_1$ fields, simultaneous reception has not been widely used. To minimize the interaction between the surface coils and the volume coils, phased arrays consisting of counter rotating current (CRC) surface coils (two parallel rings carrying opposite currents), were utilized in the present invention.

This work also describes the design and construction of CRC phased arrays for simultaneous reception with a head-sized quadrature transverse electromagnetic (TEM) (12) volume coil. This method has been applied to extend the region of enhanced sensitivity for an occipital lobe phased array and a whole brain circumscribing array for imaging at, e.g., 4 T. Specifically, 1) the performance of the individual CRC coil has been characterized as a function of the distance between the loops; 2) the spatial profile of the "optimized" CRC coil has been compared to that of a conventional single-turn surface coil of the same size; 3) the performance of a circumscribing CRC array has been compared to that of a similar array of single turn-surface coils and 4) increased SNR (~40%) afforded by simultaneous reception with the CRC array and the volume coils has been demonstrated for central brain regions using both an occipital array and a circumscribing array.

CRC surface coil arrays for 4 T MRSI of the human brain have been developed and are disclosed herein. The CRC coils provide sensitivity similar to conventional single-turn surface coil and can be used simultaneously with the homogeneous transmit volume coil for reception. No active detuning of the transmit volume coil is required due to intrinsic isolation of the CRC and volume coils which substantially simplifies the transmit volume coil design and construction.

The critical $Q_U/Q_L$ ratio of about 2, measured in this work for CRC coils of two different sizes, characterizes the point below which where sensitivity of the CRC coil is substantially decreased. This is an important result in that for optimal CRC coil performance sample losses only need to be equivalent to intrinsic coil losses, which is a relatively easy criteria to satisfy. Although the method described herein provides a simple recipe for CRC coil evaluation and adjustment, it is noteworthy that the value obtained is empirical and may change depending on the CRC coil size and geometry. Also since at higher fields the surface coil sensitivity profile can be modified by RF field/tissue interaction this result may also be field dependent. Since the contribution of the sample loss, an important factor for optimization of CRC coils, becomes more pronounced at higher frequency, CRC coils may provide great potential in high-field imaging and spectroscopy of human body and brain.

The four-channel circumscribing CRC phased array and a quadrature head-sized TEM volume coil disclosed herein is capable of simultaneous transmission and reception. Using this system enables substantial improvements in the homogeneity of the transmit $B_1$ profile as compared to the volume coil alone, which becomes more pronounced with increasing field strength. Further improvements in $B_1$ field homogeneity should be obtained with larger numbers of surface coils in the phased array.

REFERENCES

1. Roemer P B, Edelstein W A, Hayes, C E, Souza S P, and Mueller O M. The NMR phased array. Magn Reson Med 1990; 16:192-225.
2. Schäffter T, Börnert P, Leussler C, Carlsen I C, Leibfritz. Fast $^1$H spectroscopic imaging using a multi-element head-coil array. Magn Reson Med 1998; 40:185-193.
3. Porter J R, Wright S M, Reykowski A. A 16-element phased-array head coil. Magn Reson Med 1998; 40:272-279.
4. Kocharian A, Felmlee J P, McGee K P, Riederer S J, and Ehman R L. Simultaneous image acquisition utilizing hybrid body and phased array receiver coils. Magn Reson Med 2000; 44:660-663.
5. Kocharian A, Lane J I, Bernstein M A, Lin C, Witte R J, Huston III J, Felmlee J P. Hybrid phased array for improved internal auditory canal imaging at 3.0 T MR. J Magn Res Imag 2002; 16:300-304.
6. Tropp J, Schirmer T. Spatial dependence of a differential shading artifact in images from coil arrays with reactive cross-talk at 1.5 T. J Magn Reson 2001; 151:146-151.
7. Froncisz W, Jesmanowicz A, Kneeland J B, and Hyde J S. Counter rotating current local coils for high-resolution magnetic resonance imaging. Magn Reson Med 1986; 3:590-603.
8. Hyde J S, Froncisz W, Jesmanowicz A, and Kneeland J B. Simultaneous image acquisition from the head (or body) coil and a surface coil. Magn Reson Med 1988; 6:235-239.
9. Kneeland J B, Jesmanowicz A, Froncisz W, and Hyde J S. Simultaneous reception from a whole-volume coil and a surface coil on a clinical MR system. Radiology 1988; 169:255-257.
10. Suits B H, Garroway A N, and Miller J B. Noise-Immune Coil for Unshielded Magnetic Resonance Measurements, J Magn Res 1998; 131:154-158.
1. Seton H C, Hutchison J M S, and Bussell D M. Gradiometer pick-up coil design for a low field SQUID-MRI system, MAGMA 1999; 8:116-120.
12. Vaughan J T, Hetherington H P, Otu J O, Pan J W, Pohost G M. High frequency volume coils for clinical NMR imaging and spectroscopy. Magn Reson Med 1994; 32:206-218.
13. Carlson J W. Power deposition and noise correlation in NMR samples. Magn Res Med 1989; 10:399-403.
14. Tropp J. Correlated noise from separate receiver coils. In: Proceedings of the 10$^{th}$ annual meeting of SMRM, 1991, p 727.
15. Levine I N. Quantum Chemistry. Englewood Cliffs, N.J.: Prentice Hall; 1991.
16. Taves T, Kasian L, King S B. The SNR of spiral birdcage coils. In: Proceedings of the 12$^{th}$ annual meeting of ISMRM, Kyoto, Japan, 2004, p 40.

17. Mueller M, Blaimer M, Heidemann R, Webb A, Griswold M, Jakob P. 8 channel double spiral head array coil for enhanced 3D parallel MRI at 1.5 T. In: Proceedings of the 12$^{th}$ annual meeting of ISMRM, Kyoto, Japan, 2004, p 2391.
18. Hayes C E, Edelstein W A, Schenck J F, Mueller O M, and Eash M. An efficient, highly homogeneous radiofrequency coil for whole-body imaging at 1.5 T. J Magn Reson 1985; 63:622-628.
19. Vaughan J T, Adriany G, Garwood M, Yacoub T, Duong T, DelaBarre L, Andersen P, and Ugurbil K. Detunable transverse electromagnetic (TEM) volume coil for high field NMR. Magn Reson Med 2002; 47:990-1000.
20. Avdievich N I, and Hetherington H P. A 4 T actively detunable transmit/receive $^1$H transverse electromagnetic (TEM) and 4-channel receive-only phased array for human brain studies, Magn Res Med 2004; 52:1459-1464.
21. Beck B L, Blackband S J. Phased array imaging on a 4.7 T/33 cm animal research system. Rev Sci Instrum 2001; 11:4292-4294.
22. Reykowski A, Wright S M, Porter J R. Design of Matching Networks for Low Noise Preamplifiers. Magn Reson Med 1995; 33:848-852.
23. de Zwart J A, Ledden P J, Kelman P, van Gelderen P, and Duyn J H. Design of a SENSE-optimized high-sensitivity MRI receive coil for brain imaging. Magn Reson Med 2002; 47:1218-1227.
24. Poole C P J. Electron spin resonance: a comprehensive treatise on experimental techniques. New York: Wiley; 1983.
25. Pan J W, Twieg D B, and Hetherington H P. Quantitative spectroscopic imaging of the human brain. Magn Reson Med 1998; 40:363-369.
26. Vaughan J. T., M. Garwood, C. M. Collins, W. Liu, L. DelaBarre, G. Adriany, P. Andersen, H. Merkle, R. Goebel, M. B. Smith, K. Ugurbil. 7T vs. 4T: RF power, homogeneity, and signal-to-noise comparison in head images, Magn Reson Med 2001; 46:24-30.
27. Wang J, Yang Q X, Zhang X, Collins C M, Smith M B, Zhu X H, Adriany G, Ugurbil K, Chen W. Polarization of the RF Field in a human head at high field: a study with a quadrature surface coil at 7.0T. Magn Reson Med 2002; 48:362-369.
28. Barfuss H, Fischer H, Hentschel D, Ladebeck R, Oppelt A, and Wittig R. In vivo magnetic resonance imaging and spectroscopy of humans with 4T whole-body magnet. NMR in Biomed 1990; 3(1):31-45.
29. Tamer S. Ibrahim, Robert Lee, Brian A. Baertlein, Amir M. Abduljalil, Hui Zhu and Pierre-Marie L. Robitaille. Effect of RF coil excitation on field inhomogeneity at ultra high fields: a field optimized TEM resonator, Magn. Res. Imag. 2001; 19:1339-1347.
30. Ledden P. Transmit homogeneity at high fields: computational effects of "B1 shimming" with an eight element volume coil. In: Proceedings of the 13$^{th}$ annual meeting of ISMRM, Toronto, Canada, 2003, p 2390.
31. Gregor Adriany, Pierre-Francois Van de Moortele, Florian Wiesinger, Steen Moeller, John P. Strupp, Peter Andersen, Carl Snyder, Xiaoliang Zhang, Wei Chen, Klaas P. Pruessmann, Peter Boesiger, Tommy Vaughan, Kâmil Uğurbil. Transmit and receive transmission line arrays for 7 Tesla parallel imaging, Magn Reson Med 2005; 53: 434-445.
32. Ibrahin T S et al. Effect of RF coil excitation on field inhomogeneity at ultra high fields: a field optimized TEM resonator. Magn Reson Imag 2001; 19: 1339-1347.
33. Avdievich, N. I., Hetherington, H. P., Simultaneous reception from a head volume coil and an array of counter rotating current (CRC) surface coils at 4 T—an Alternative to Using Actively Detuned Transmit Volume Coils. In: Proceedings of the 13$^{th}$ annual meeting of ISMRM, Miami Beach, Fla., 2005, p 327.

What is claimed is:

1. A surface coil array for simultaneous reception of a radio frequency magnetic field signal with a volume coil during imaging, the array comprising a plurality of counter rotating current (CRC) coils arranged for positioning over the surface of a region to be imaged, wherein each CRC coil contains two parallel loops in separate parallel planes where current flows in opposite direction in each loop, wherein the CRC coil array is intrinsically decoupled from the volume coil due to the presence of two counter rotating loops in separate parallel planes in each coil, and wherein the CRC coil array provides simultaneous reception of the radio frequency magnetic field signal with the volume coil during imaging.

2. A method of imaging a region of a subject comprising simultaneously receiving a radio frequency magnetic field by the surface coil array of claim 1 and by a volume coil.

3. A surface coil phased array for simultaneous transmission and reception of a radio frequency magnetic field signal with a quadrature volume coil during imaging, the array comprising at least four counter rotating current (CRC) coils uniformly arranged for positioning around the surface of a region to be imaged, wherein each CRC coil contains two parallel loops in separate parallel planes where current flows in opposite direction in each loop, wherein the CRC coil array is intrinsically decoupled from the volume coil due to the presence of two counter rotating loops in separate parallel planes in each coil, wherein the radio frequency magnetic field transmitted by an individual coil is shifted out of phase with the radio frequency magnetic field transmitted by adjacent coils to produce a circularly polarized radio frequency magnetic field that is in phase with a circularly polarized radio frequency magnetic field generated by the quadrature volume coil, and wherein the CRC coil phased array provides simultaneous transmission and reception of the radio frequency magnetic field signal with the volume coil during imaging.

4. The surface coil array of claim 1 or 3, wherein distance between loops of each coil is adjusted to optimize i) decoupling between CRC surface coils in the array and the volume coil and ii) sensitivity of the CRC coil for reception.

5. The surface coil array of claim 1 or 3, wherein distance between loops of each coil is optimized according to coil geometry and imaging conditions.

6. The surface coil array of claim 5, wherein distance between loops is optimized according to the diameter of loop and the resonance frequency of the coil.

7. The surface coil array of claim 1 or 3, wherein the array has a ratio $Q_U/Q_L$ between the unloaded Q-factor ($Q_U$) and the loaded Q-factor ($Q_L$) of at least 2.0,
where $$Q_L = \omega_0 W_t/P_{sample} + P_{coil} \text{ and } Q_U = \omega_0 W_t/P_{coil},$$

$\omega_0$ is the resonance frequency, $W_t$ is the total magnetic field energy, and $P_{sample}$ and $P_{coil}$ are sample and coil energy losses, respectively.

8. The surface coil array of claim 1 or 3, wherein preamplifier decoupling of the CRC coils is used to reduce volume coil radio frequency magnetic field distortions.

9. The surface coil array of claim 1 or 3, wherein simultaneous reception of the radio frequency magnetic field by the surface coil array and by the volume coil results in an increase in signal-to-noise ratio (SNR) up to square root of 2 in areas where the surface coils and the volume coil have similar sensitivity, compared to the SNR obtained by the volume coil or by the surface coil array in the absence of simultaneous reception.

10. The surface coil array of claim 3, wherein homogeneity of the transmitted radio frequency magnetic field is improved by simultaneous transmission of the radio frequency magnetic field by the surface coil array and by the volume coil, compared to the homogeneity in the absence of simultaneous transmission.

11. A radio frequency (RF) system for imaging comprising the surface coil array of claim 1 or 3, and a quadrature volume coil.

12. The RF system of claim 11, which further comprises preamplifier decoupling of the CRC coils.

13. A method of imaging a region of a subject comprising simultaneously transmitting and receiving a radio frequency magnetic field by the surface coil phased array of claim 3 and by a quadrature volume coil.

14. The method of claim 2 or 13, wherein simultaneous reception of the radio frequency magnetic field by the surface coil array and by the volume coil results in an increase in signal-to-noise ratio (SNR) up to square root of 2 in areas where the surface coils and the volume coil have similar sensitivity, compared to the SNR obtained by the volume coil or by the surface coil array in the absence of simultaneous reception.

15. The method of claim 13, wherein homogeneity of the transmitted radio frequency field is improved by simultaneous transmission of the radio frequency field by the surface coil array and by the volume coil, compared to the homogeneity in the absence of simultaneous transmission.

16. The method of claim 2 or 13, which further comprises preamplifier decoupling of the CRC coils to reduce volume coil radio frequency magnetic field distortions.

17. The method of claim 2 or 13, wherein a central brain region is imaged.

* * * * *